United States Patent [19]
Iijima

[11] Patent Number: 5,892,686
[45] Date of Patent: Apr. 6, 1999

[54] WAFER PROBER SYSTEM

[75] Inventor: Toshihiko Iijima, Yamanashi-ken, Japan

[73] Assignee: Tokyo Electron Limited, Tokyo, Japan

[21] Appl. No.: 760,404

[22] Filed: Dec. 4, 1996

[30]        Foreign Application Priority Data

Dec. 5, 1995  [JP]  Japan ................................ 7-316607

[51] Int. Cl.$^6$ .................................................. G01R 31/02
[52] U.S. Cl. ............................................ 364/490; 324/754
[58] Field of Search ................................... 364/481, 490, 364/491, 489; 324/500, 501, 537, 752, 751, 754; 250/548

[56]              References Cited

U.S. PATENT DOCUMENTS 4,644,172  2/1987  Sandland et al. ...................... 250/548
4,878,179  10/1989  Larsen et al. ........................... 364/490

FOREIGN PATENT DOCUMENTS 60-29291  2/1985  Japan .
7-113764  5/1995  Japan .

Primary Examiner—Melanie Kemper
Attorney, Agent, or Firm—Oblon, Spivak, McClelland, Maier & Neustadt, P.C.

[57]                 ABSTRACT

A wafer prober system includes a host computer, and a prober device. The prober device includes a plurality of prober circuits, and a plurality of touch screens, each connected to the prober circuit for simultaneously displaying image data and display data from said prober circuit, each of the prober circuit including an image processing section for sequentially photographing wafers checked by probes and outputting image data, a display control section for outputting display data according to the checking, and a prober control section for controlling the outputs of the image processing section and display control section. The control section outputs the image data and display data from the prober circuit, so that the image data and display data are displayed on the touch screen at the same time. Image data and display data are selectively provided by one of prober circuits, from image data and display data displayed on each of touch screens, and are simultaneously displayed on the host computer.

5 Claims, 4 Drawing Sheets

WAFER PROBER SYSTEM

BACKGROUND OF THE INVENTION

1. Field of the Invention

The present invention relates to a wafer prober system comprising a plurality of prober devices each having probers or pins which are to be in contact with test points or conductive pads of a semiconductor circuit, such as a large-scale integrated circuit, formed on a semiconductor wafer.

2. Description of the Related Art

Generally, a system for testing a circuit, such as a large-scale integrated circuit (hereinafter, referred to as "LSI") formed on a semiconductor wafer, has a plurality of test stations which are independently connected to an operation and measuring unit. To each of the test stations, a prober device having an electronics portion with probes, is provided. LSI's are tested by operating a plurality of prober devices independently and simultaneously, while each of the test operations is being monitored on the screen provided to each of the prober devices. For monitoring, an operator or operators must work for each prober device to check whether each prober device is normally working or not. Thus, the conventional system mentioned is significantly disadvantageous in view of labor cost.

SUMMARY OF THE INVENTION

The object of the present invention is to provide a wafer prober system without the need for individual monitor observation for each of prober devices, even if a plurality of prober devices are simultaneously operated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
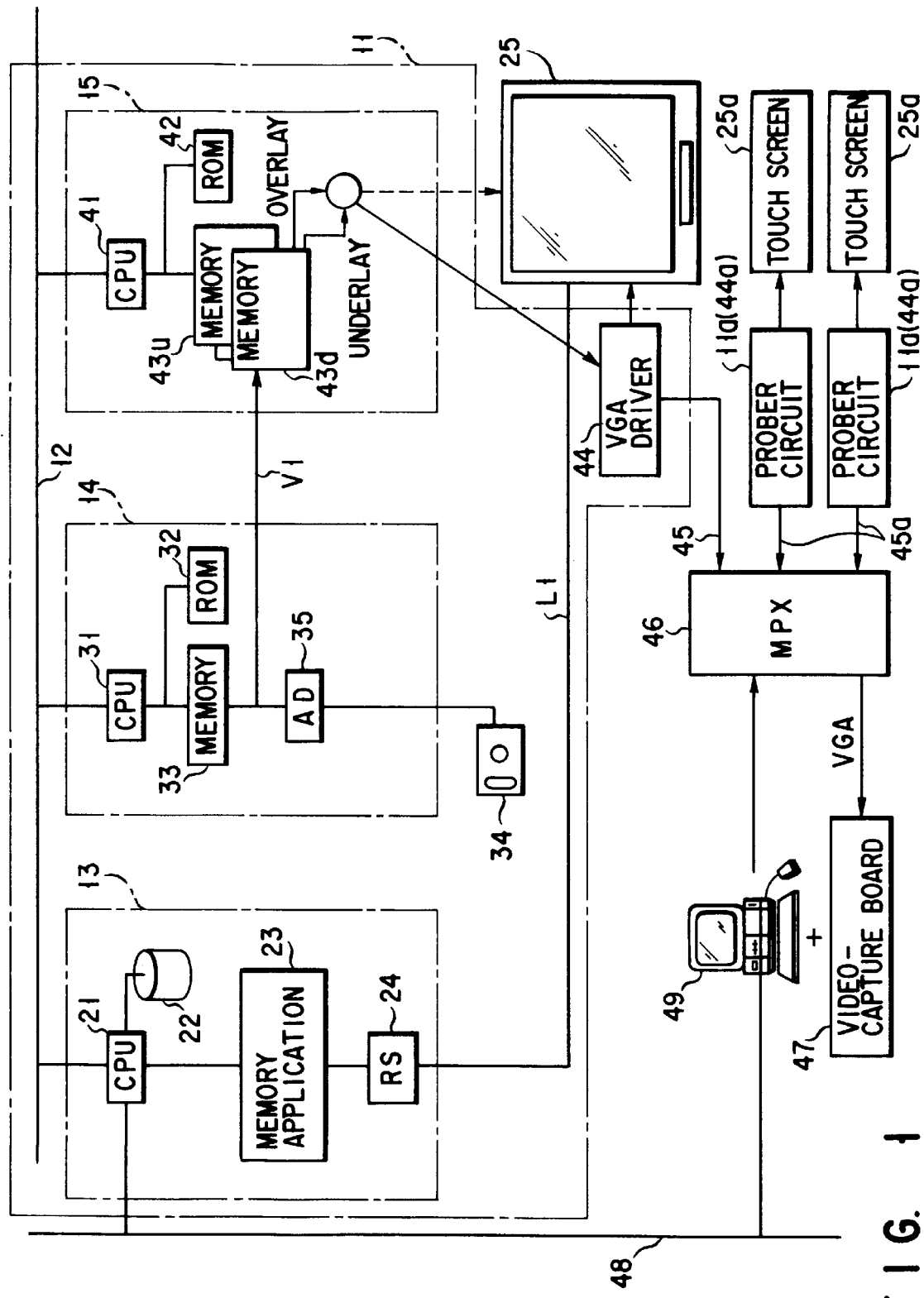
FIG. 1 is a diagram of a wafer prober system according to a first embodiment of the present invention.

Hereinbelow, we will explain a first embodiment of the present invention with reference to FIG. 1. In FIG. 1, reference numeral 11 denotes a prober circuit which has a plurality of probes (pins) each being in contact with and electrically connected to test portions of LSI, such as electrode pads. To system bus 12 of the prober circuit 11, a prober control section 13 for controlling probers, an image processing section 14 for processing images, and a display control section 15 for controlling displays are individually connected. On the basis of the data derived from a touch screen or from a host computer (described later), the prober control section 13 drives and controls the image processing section 14 and the display control section 15 to do predetermined work thereof.

A main construction of the prober section 13 is a CPU 21 which is connected to the system bus 12. To the CPU 21, a disk device 22 and a memory application 23 are connected. The disk device 22 stores programs and parameters for controlling a prober. The memory application 23 stores map data. To the memory application 23, the output side of the touch screen 25 is connected by way of an RS interface 24 and a signal line L1. Hence, touch screen data obtained when the touch screen 25 is operated, are transmitted through the signal line L1 to the RS interface 24 in the prober control portion 13, converted into signals, and input into the memory application 23, in which the data signals are processed.

In the image processing section 14, reference numeral 31 indicates a CPU which is connected to the system bus 12, for collectively controlling the image processing section. To the CPU 31, a ROM 32 and a memory 33 are individually connected. The ROM 32 stores control programs for processing various images. The memory 33 stores image data for wafer alignment and probe tips. To the memory 33, a photographing device 34 including, for example, a CCD camera, is connected via an AD converter 35. The photographing device 34 photographs the alignment images of semiconductor-wafers placed on a main chuck (not shown) and the images of prober tips, and outputs the images in the form of data signals. The analog data signals of the images derived from the photographing device 34 are converted into digital data signals by the AD converter 35 and then stored in the memory 33.

The image data converted into digital signals by the AD converter 35 are output into the display control section 15. In the display control section 15, reference numeral 41 indicates a CPU which is connected to the system bus 12, for collectively controlling the display control section. To the CPU 41, a ROM 42 for storing programs for controlling the display, an overlay memory 43u, and an underlay memory 43d are individually connected.

The output sides of both memories 43u and 43d are connected to the input side of a VGA driver 44. The display data signals derived from these memories are input into the VGA driver 44. A first output side of the VGA driver 44 is connected to the input side of the touch screen 25. A second output side of the VGA driver 44 is connected to one of a plurality of input terminals of a multiplexer 46 by way of an optical fiber cable 45.

The display screen of the touch screen 25 has an upper screen and a lower screen. On the upper screen, display data (e.g., character data) stored in the overlay memory 43u, are displayed. On the lower screen, display data (e.g., alignment images and tip images photographed by the camera 34) stored in the underlay memory 43d, are displayed as motion pictures.

At other input terminals of the multiplexer 46, other prober devices, each including a prober circuit 11a including a VGA driver 44a and a touch screen 25a, are individually connected by way of optical fiber cables 45a. The prober circuit 11a and the VGA driver 44a are constructed and connected in the same manner as the prober circuit 11 and the VGA driver 44 as mentioned above. Therefore, the explanation is omitted. In the figure, three prober circuits 11 and 11a are connected to the multiplexer 46. However, in practice, prober circuits more than three, for example, 8 prober circuits, may be connected.

The multiplexer 46 selects one of all display-data signals input into the multiplexer 46 from the VGA drivers 44 and 44a, and inputs it into a video capture board 47 incorporated in a host computer 49 having a display screen, which is connected to the output side of the multiplexer 46.

In FIG. 1, reference numeral 48 denotes a LAN (local area network) constituted of a circuit such as Ethernet. The LAN 48 further connects the CPU 21 of the prober control section 13 to the host computer 49. Therefore, the prober control section 13 can be driven on the basis of the data derived from the host computer 49 similarly on the basis of the data from the touch screen 25. In other words, in this device, the prober circuit 11 can be driven not only by the data from the host computer 49 and but also by the data from the touch screen 25. The operation can be driven by the touch screen means as well as by input means such as a key or a mouse.

Hereinbelow, we will explain the operation of the device according to a first embodiment of the present invention, having the aforementioned structure. In the first place, data necessary for operating a prober circuit 11 are input by use of the input means, provided to the touch screen 25 and the host computer 49. The data input in the touch screen 25, namely, map data, are transmitted to the application 23 of the prober control section 13 by way of signal line L1, on the basis of the RS232C standard and stored therein. On the basis of the map data stored in the memory application 23, the CPU 21 drives the image processing section 14 and the display control section 15 individually. Simultaneously, the touch screen data are output into the host computer 49 by way of the LAN 48 and stored in the memory (not shown) of the host computer 49.

Conversely, when the map data are input in the host computer 49 by means of a touch screen, a keyboard and/or a mouse, the prober control section 13 can be operated in the same way as mentioned above by way of LAN 48.

When the image processing section 14 is driven, the photographing device 34 sequentially photographs images of wafer alignment and probe tips during measurement using the prober circuit 11. The images of the wafer alignment and tips photographed by the photographing device 34 are converted into digital data by the AD converter 35, transmitted through video bus V1, and stored in the underlay memory 43d of the display control portion 15 as motion picture data, in a sequential manner.

Simultaneously with the operation of the image processing portion 14, the display data, such as guide messages, made up in the display control section 15, are stored in the overlay memory 43u. The display data stored in the overlay memory 43u and the motion picture data stored in the underlay memory 43d are output into the VGA driver 44. By the VGA driver 44, the display data are displayed on the upper layer of the touch screen 25 and the images of the wafer alignment and the probe tips photographed by the camera 34 are displayed on the lower layer thereof.

The display data stored in the overlay memory 43u and the motion picture data stored in the underlay memory 43u are output into the video capture board 47 by way of the multiplexer 46. The motion picture data incorporated in the video capture board 47 are displayed on the screen of the host computer 49. In this way, the display data such as guide messages and the alignment image and motion-picture images of the probe tips can be displayed on the screen of the host computer 49. The display of the touch screen 25 of the prober circuit 11 can be observed on the display screen of the host computer 49.

When the same operation is repeated by choosing another prober circuit 11a by using the touch screen, keyboard, or mouse of the host computer 49, the display data such as guide messages of the prober circuit 11a and the image pictures of the wafer alignment and the motion-picture image of the probe tips photographed by the camera 34, can be newly displayed by replacing for those obtained by using the prober circuit 11.

For example, by placing a plurality of prober circuits 11 and 11a in a clean room and the host computer 49 connected to the prober circuits outside the clean room, the wafer conditions checked by each of the prove devices, can be monitored sequentially or selectively by the host computer 49 outside the clean room, without entering the clean room.

Hereinbelow, we will explain a second embodiment of the present invention with reference to FIGS. 2 and 3.

In the second embodiment, a plurality of prober devices constructed as shown in FIG. 1 are individually connected to a common host computer 49. Some or all of image data provided by the prober devices can be selected and simultaneously displayed on the host computer 49.

Figure 2:
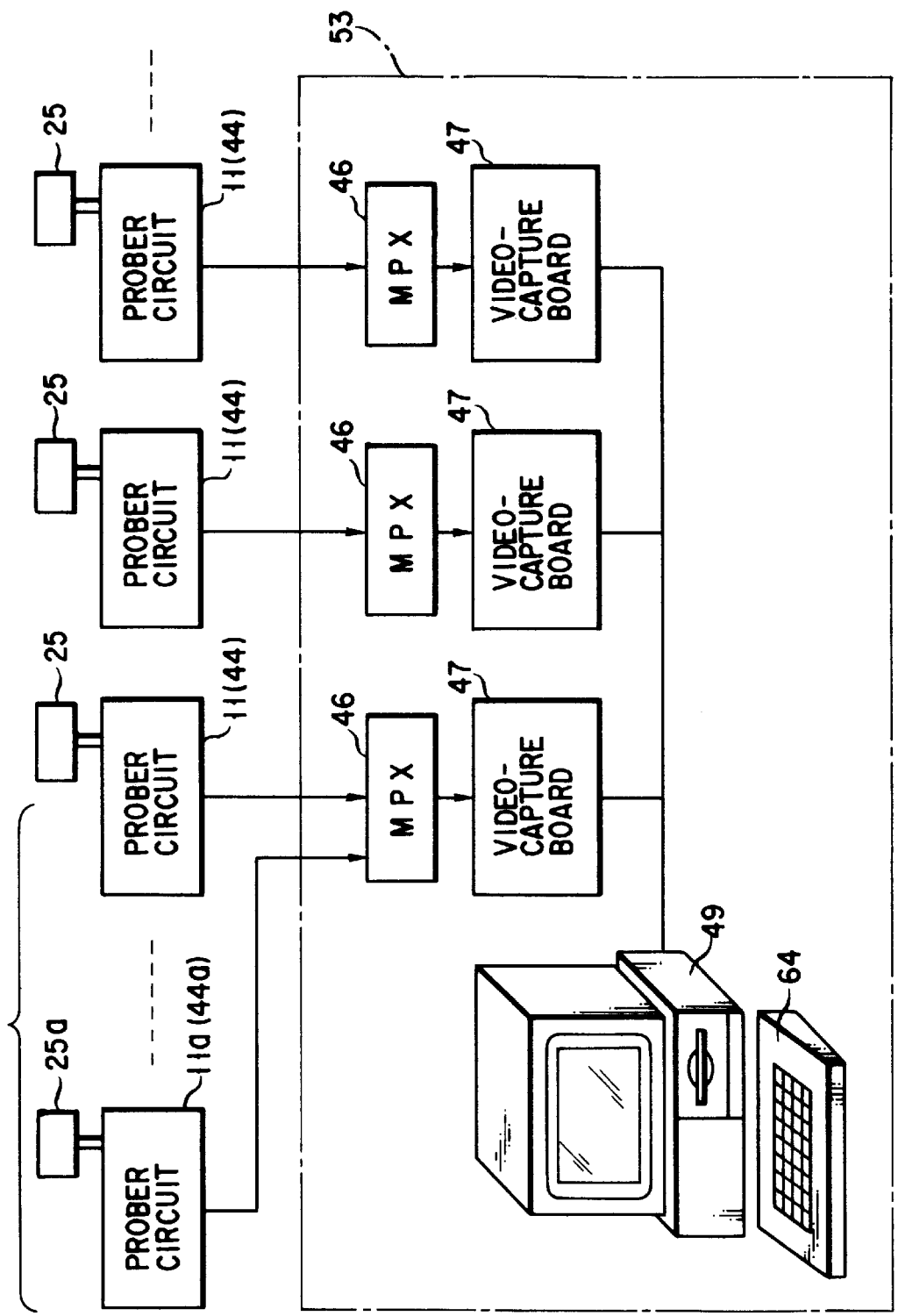
FIG. 2 is a diagram of a wafer prober system according to a second embodiment of the present invention.

In FIG. 2, reference numeral 11 denotes a prober circuit having a VGA driver 44. To each of the prober circuits 11, a touch screen 25 receiving signals from the VGA driver 44, and a multiplexer 46 are connected. To each of multiplexer 46, a plurality of (seven in this embodiment) prober circuits 11a having a VGA driver 44a are connected, other than the prober circuit 11. Therefore, a prober device comprises 8 prober circuits in total, and the touch screens 25 and 25a in the corresponding number (8). A desired prober data from each prober circuit can be displayed on the corresponding touch screen in the same way as in the embodiment depicted in FIG. 1.

Each of the multiplexers 46 is connected to each of the video capture boards 47. The output sides of the video capture boards 47 are connected to an input side of the common personal computer 49. On the front panel of the computer 49, selector buttons 61, a screen 62, and cursor controller or switch 63 are provided, as shown in FIG. 3. The screen used herein may be a CRT screen or a touch-panel screen. The selector buttons 61, which are numbered from 1 to 8 which correspond to a first to eighth prober circuit of each of the prober devices, act as switches to select prober data to be displayed on the screen. In this embodiment, to select a plurality of prober devices from the 16 prober devices, a keyboard 64 is provided. For example, 4 prober devices are selected from 16 prober devices by use of the keyboard, and then one prober circuit is selected from 8 prober circuits provided in each of the selected 4 prober devices, by pressing the selector buttons 61. In this manner, image data and display data from the 4 prober circuits individually selected from the 4 prober devices are simultaneously displayed on the screen of the host computer 49.

The selecting means for the prober devices, the selector means for selecting one of prober circuits of the selected prober devices are not limited to the keyboard 64 and selector buttons 61, respectively as is in the aforementioned embodiment and may be modified in various ways. Either keyboard or selector buttons may execute both selections mentioned above. Alternatively, the selections may be carried out by use of a touch screen.

As mentioned above, since the touch screen data of a plurality of prober circuits can be simultaneously displayed on the common screen 62, a plurality of prober devices can be monitored by the common host computer 49 at the same time.

Figure 4:
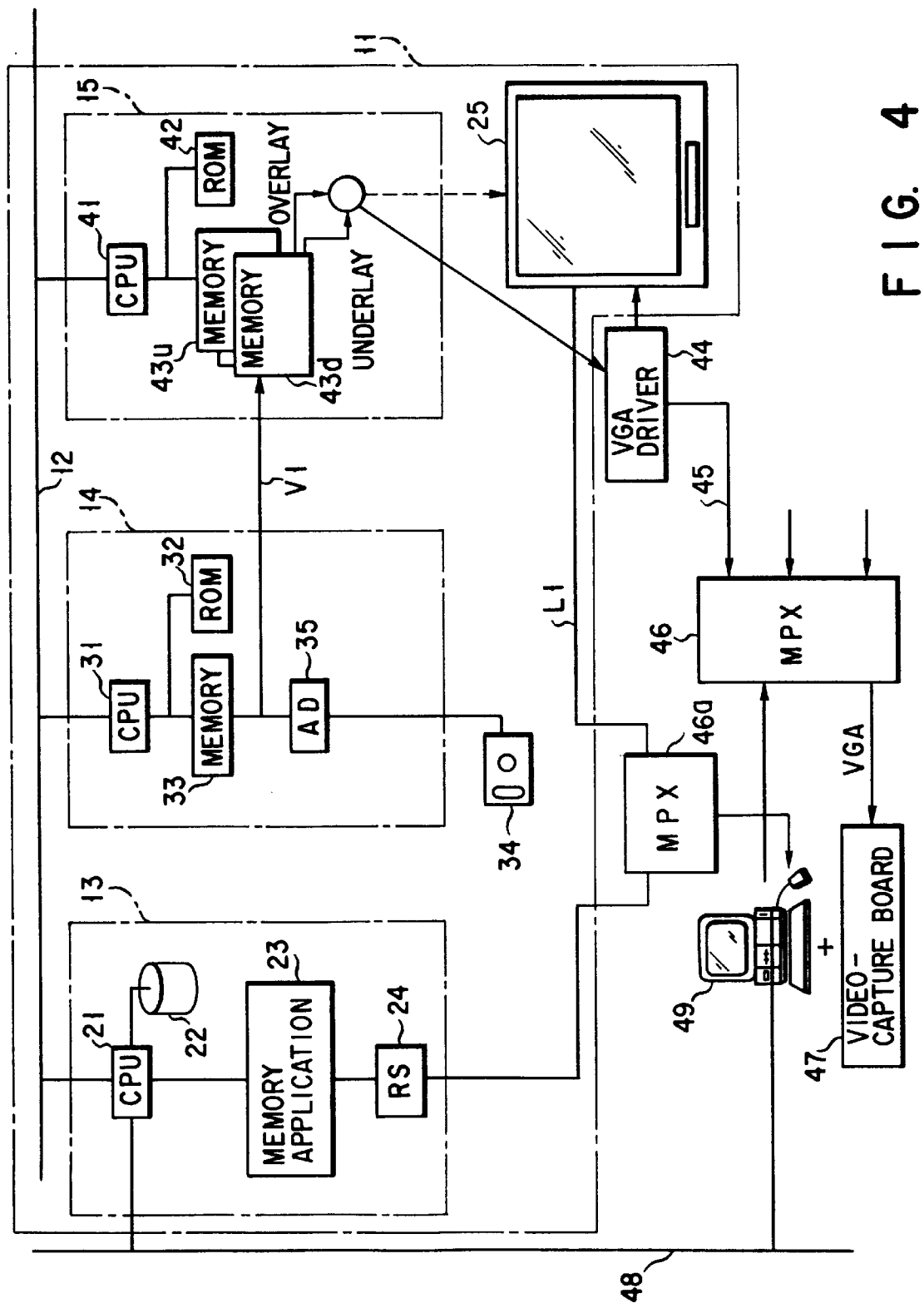
FIG. 4 is a diagram showing a modified example of the first embodiment.

Incidentally, although the RS interface 24 is connected to the touch screen 25 by way of signal line L1 in FIG. 1, it may be connected by way of the multiplexer 46a and the signal line L1, as shown in FIG. 4.

In this construct, the host computer can be directly connected to the display and the touch screen 25 of the prober device. Consequently, the load of the circuit, such as LAN, can be reduced.

Figure 3:
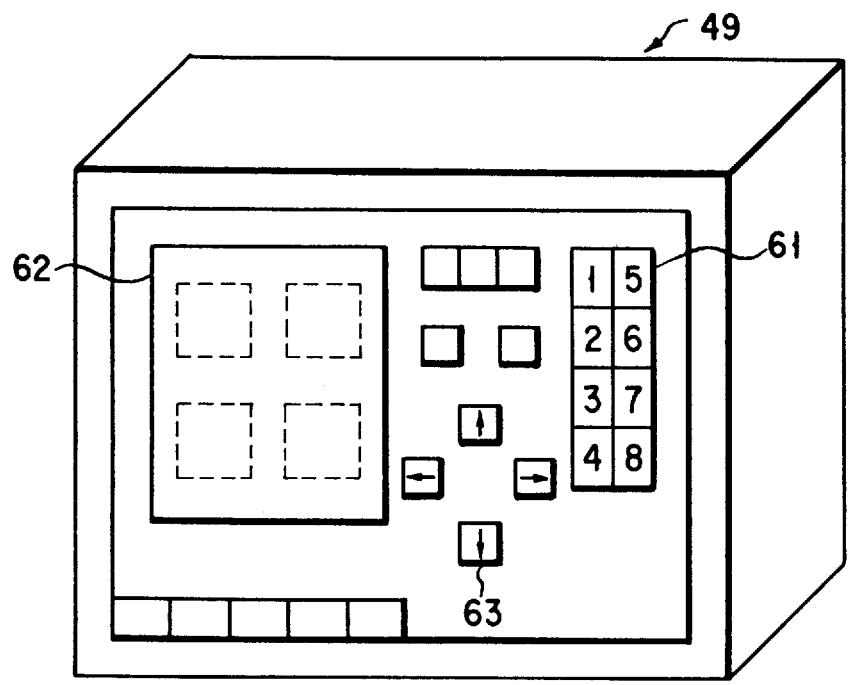
FIG. 3 is a view of a CRT display screen for use in explaining a modified example of the present invention.
Figure 5:
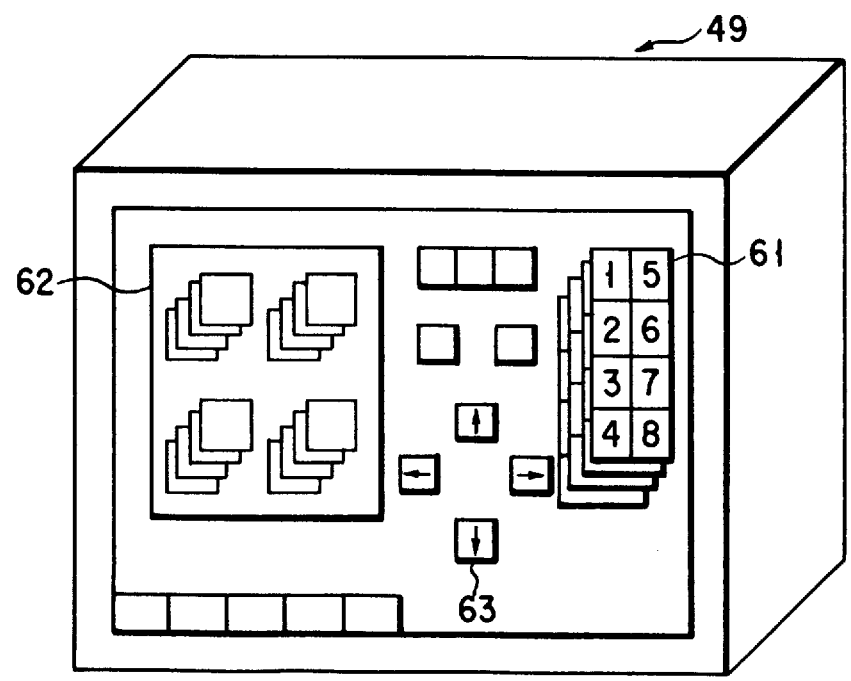
FIG. 5 is a view of the screen of a host computer displaying windows.

FIG. 5 shows the screen of the host computer 49 shown in FIG. 3, which is modified and designed so as to display windows. The touch channel selector buttons 61 for selecting the windows correspond to the prove devices in number. When a set of the selector buttons 61 for a desired probe device is displayed on the screen by use of keys or a mouse and desired numbers of the selector buttons are pressed, a plurality of prober data from a desired prober circuits of a desired probe device can be simultaneously displayed in a sequential manner.

As is described in the above, since the display contents derived from the touch screen of a prober device can be transmitted to a host computer in the present invention, a wafer prober system capable of monitoring a plurality of probers by a host computer, can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A wafer prober system comprising:
   a host computer having a display screen;
   a prober device including:
      a plurality of prober means each for outputting image data and display data; and
      a plurality of touch screens, each connected to the prober means for simultaneously displaying image data and display data from said prober means;
   wherein each of said prober means includes:
      an image processing section for sequentially photographing wafers checked by probes and outputting image data, a display control section for outputting display data according to said checking, and a prober control section for controlling the outputs of said image processing section and display control section;
      operating means having input means provided to the host computer and touch screens for driving said control section, outputting said image data and display data from said prober means, and displaying said image data and display data on the touch screen and display screen at the same time; and
      selecting and display means for selecting image data and display data provided by one of prober means, from image data and display data displayed on each of said plurality of touch screens, and simultaneously displaying said image data and display data selected on said display screen, wherein said selecting and displaying means has a video capture board for said host computer and a multiplexer, to the output side of which said video capture board is connected and to the input side of which output sides of said plurality of prober means are connected.

2. The system according to claim 1, wherein said input means has at least one of a keyboard, a touch screen, and a mouse.

3. A wafer prober system comprising:
   a host computer having a display screen;
   a prober device including:
      a plurality of prober means each for outputting image data and display data, and
      a plurality of touch screens, each connected to the prober means for simultaneously displaying image data and display data from said prober means;
   wherein each of said prober means include:
      an image processing section for sequentially photographing wafers checked by probes and outputting image data, a display control section for outputting display data according to said checking, and a prober control section for controlling the outputs of said image processing section and display control section;
      operating means having input means provided to the host computer and touch screens for driving said control section, outputting said image data and display data from said prober means, and displaying said image data and display data on the touch screen and display screen at the same time; and
      selecting and display means for selecting image data and display data provided by one of prober means, from image data and display data displayed on each of said plurality of touch screens, and simultaneously displaying said image data and display data selected on said display screen;
   wherein said display control section comprises:
      first memory means for storing image data derived the image processing section;
      second memory means for storing display data; and
      a central processing unit (CPU) for controlling first and second memory means;
   wherein said image processing section comprises:
      photographing means for photographing a wafer and outputting image data of said wafer; and
      a central processing unit (CPU) for controlling the transmission of said image data to said first memory means;
   wherein said prober control section comprises:
      a central processing unit (CPU) for controlling said CPUs provided in said image processing section and display controlling section; and
      a local area network for connecting said CPU provided in said prober controlling section and said host computer.

4. A wafer prober system comprising:
   a host computer;
   a plurality of prober devices each includes:
      a plurality of prober means for outputting displaying image and display data; and
      a plurality of touch screens each connected to the probe means for simultaneously displaying image data and display data from said prober means;
   wherein each of said prober means includes:
      an image processing section for sequentially photographing wafers checked by probes and outputting image data, a display control section for outputting display data according to said checking, and a prober control section for controlling the output of said image processing section and display control section;

operating means having input means provided to the host computer and touch screens for driving each control section of prober means of said prober devices, outputting said image data and display data from the corresponding prober means, and displaying said image data and display data on each of said touch screens and said display screen at the same time; and selecting and display means for selecting image data and display data derived from a plurality of prober devices from image data and display data displayed on touch screens of said plural prober devices, and simultaneously displaying said image data and display data selected on said display screen, wherein said selecting and displaying means has a plurality of video capture boards for said host computer and a plurality of multiplexers, the output side of which are connected to said video capture boards and to the input side of which the output sides of said plural prober devices are connected.

5. The system according to claim 4, wherein said input means includes at least one of a keyboard, a touch screen and a mouse.

* * * * *